(12) United States Patent
McCord et al.

(10) Patent No.: US 8,373,144 B1
(45) Date of Patent: Feb. 12, 2013

(54) QUASI-ANNULAR REFLECTIVE ELECTRON PATTERNING DEVICE

(75) Inventors: Mark A. McCord, Los Gatos, CA (US); Paul F. Petric, Pleasanton, CA (US); Allen Carroll, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 346 days.

(21) Appl. No.: 12/873,158

(22) Filed: Aug. 31, 2010

(51) Int. Cl.
*G21K 1/02* (2006.01)

(52) U.S. Cl. ............... 250/492.22; 250/396 R; 250/398; 250/492.1; 250/492.23; 250/492.3

(58) Field of Classification Search ............ 250/396 R, 250/398, 492.1, 492.2, 492.22, 492.23, 492.3
See application file for complete search history.

(56) References Cited

U.S. PATENT DOCUMENTS

| | | | |
|---|---|---|---|
| 5,254,417 A * | 10/1993 | Wada | ............................ 430/5 |
| 5,504,385 A | 4/1996 | Jin et al. | |
| 5,588,894 A | 12/1996 | Jin et al. | |
| 5,681,196 A | 10/1997 | Jin et al. | |
| 5,698,934 A | 12/1997 | Jin et al. | |
| 5,821,679 A | 10/1998 | Makishima | |
| 6,177,218 B1 | 1/2001 | Felker et al. | |
| 6,207,965 B1 | 3/2001 | Koike | |
| 6,215,578 B1 * | 4/2001 | Lin | ............................ 359/292 |
| 6,235,450 B1 | 5/2001 | Nakasuji | |
| 6,291,119 B2 | 9/2001 | Choi et al. | |
| 6,333,508 B1 | 12/2001 | Katsap et al. | |
| 6,414,313 B1 | 7/2002 | Gordon et al. | |
| 6,429,443 B1 | 8/2002 | Mankos et al. | |
| 6,511,048 B1 | 1/2003 | Sohda et al. | |
| 6,525,328 B1 | 2/2003 | Miyoshi et al. | |
| 6,573,516 B2 | 6/2003 | Kawakami | |
| 6,586,733 B1 | 7/2003 | Veneklasen et al. | |
| 6,605,811 B2 | 8/2003 | Holta et al. | |
| 6,610,890 B1 | 8/2003 | Garcia de Quesada Fort et al. | |
| 6,657,211 B2 | 12/2003 | Benner | |
| 6,674,086 B2 | 1/2004 | Kamada et al. | |
| 6,870,172 B1 * | 3/2005 | Mankos et al. | .......... 250/492.22 |
| 7,061,591 B2 | 6/2006 | Bleeker et al. | |
| 7,342,238 B2 * | 3/2008 | Zywno et al. | .............. 250/492.2 |
| 7,566,882 B1 * | 7/2009 | Hess | ............................. 250/400 |
| 7,692,167 B1 * | 4/2010 | Mankos | .................... 250/492.23 |
| 2003/0210383 A1 | 11/2003 | Bjorklund et al. | |
| 2006/0170617 A1 * | 8/2006 | Latypov et al. | .................. 345/32 |
| 2008/0068569 A1 * | 3/2008 | Mulckhuyse et al. | .......... 355/53 |
| 2008/0128634 A1 * | 6/2008 | Tromp | ................... 250/396 ML |
| 2008/0169436 A1 * | 7/2008 | Carroll | ..................... 250/492.22 |
| 2009/0114837 A1 * | 5/2009 | Grella et al. | ............. 250/396 R |

FOREIGN PATENT DOCUMENTS

| | | |
|---|---|---|
| EP | 1510848 | 2/2005 |
| JP | 4294319 | 10/1992 |

\* cited by examiner

*Primary Examiner* — Michael Logie
(74) *Attorney, Agent, or Firm* — Okamoto & Benedicto LLP (57) ABSTRACT

One embodiment relates to an electron-beam apparatus for writing a pattern on a target substrate. The apparatus includes a plurality of arrays of actively-controlled pixel elements at a surface of a reflective electron patterning device. The plurality of arrays of actively-controlled pixel elements are arranged so that there is an area without any actively-controlled pixel elements in a region surrounding an optical axis of the objective lens. The plurality of arrays may be arranged to each lie on a circle centered on the optical axis. Other features, aspects and embodiments are also disclosed.

16 Claims, 10 Drawing Sheets

FIG. 6 (Conventional) 600

FIG. 5 (Conventional)

QUASI-ANNULAR REFLECTIVE ELECTRON PATTERNING DEVICE

STATEMENT REGARDING FEDERALLY SPONSORED RESEARCH OR DEVELOPMENT

The invention described herein was made with Governmental support under contract number HR0011-07-9-0007 awarded by the Defense Advanced Research Projects Agency. The Government may have certain rights in the invention.

BACKGROUND

1. Technical Field

The present invention relates generally to pattern generation technology that may be applied in an electron beam apparatus.

2. Description of the Background Art

A pattern generator for use in an electron beam apparatus may have pixel elements comprising conductive elements to which voltages may be controllably applied, for example. When a substantially uniform electron beam is mirrored from such a pattern generator, the pixel elements with a negative applied voltage may reflect (mirror) its pixel portion of the beam, while those pixel elements with a positive applied voltage may absorb its pixel portion of the beam. As a result, the reflected electron beam has a pattern imposed on it which corresponds to the pattern of voltages on the pattern generator. The reflected electron beam may then be projected onto a substrate so as to transfer the pattern to the substrate (for example, onto a resist layer on the surface of the substrate).

SUMMARY

One embodiment relates to an electron-beam apparatus for writing a pattern on a target substrate. The apparatus includes a plurality of arrays of actively-controlled pixel elements at a surface of a reflective electron patterning device. The arrays of actively-controlled pixel elements are arranged so that there is an area without any actively-controlled pixel elements in a region surrounding an optical axis of the objective lens. The arrays may be arranged to each lie on a circle centered on the optical axis.

Another embodiment relates to a method of writing a pattern on a target substrate. An incident electron beam is generated and focused onto a plurality of arrays of actively-controlled pixel elements. The actively-controlled pixel elements are controlled to selectively reflect pixel portions of the incident beam to form a reflected patterned beam. The arrays are arranged so that there is an area without any active pixel elements in a region surrounding an optical axis of the incident electron beam. The arrays may be arranged to each lie on a circle which is concentric with an optical axis of the incident electron beam.

Another embodiment relates to a quasi-annular electron patterning device for writing a pattern on a moving target substrate. The device includes: a plurality of arrays of actively-controlled pixel elements at a surface; and circuitry to shift a pattern over said arrays and to control the actively-controlled pixel elements of each said array so as to form a patterned beam by selectively reflect pixel portions of the incident beam. The plurality of arrays of actively-controlled pixel elements are arranged to each lie on a circle centered on an optical axis of the incident beam so that there is an area without any actively-controlled pixel elements in a region surrounding the optical axis.

Other features, aspects and embodiments are also disclosed.

DETAILED DESCRIPTION

As described above, a pattern generator for use in an electron beam apparatus may comprise an array of controllable pixel elements formed over an integrated circuit. The integrated circuit may use transistor circuitry underneath each pixel element to drive voltages to create a contrast pattern within the reflected beam.

The patterned beam may then be transferred, demagnified (shrunken), and projected onto a target substrate by a projection system. The target substrate may comprise, for example, a resist-coated semiconductor wafer to be exposed to the pattern for purposes of lithography.

In the following discussion, the apparatus for generating the pattern operates in a mode which translates the target substrate under the projected beam. As such, the apparatus is configured to translate the pattern across the array in synchronization with the translation of the target substrate. In other words, as the target substrate moves under the projected beam, the pattern embodied in the projected beam is moved in the same direction and speed. As such, the projected beam is able to form the pattern on the substrate while the substrate is in motion.

While the following diagrams represent the pixels by squares, the actual pixel elements in the device array may be of different shapes, such as, for example, circular, rectangular, or hexagonal. In addition, the size of the square areas shown in the diagrams does not necessarily represent the size of the reflective portions of the pixel elements. Moreover, when a pixel element reflects a pixel portion of the beam, the pixel portion is generally blurred by the time it reaches the target surface. The apparatus may be configured so that the blurring is sufficiently large such that the effective areas illuminated on the target surface by adjacent pixels have some overlap.

Exemplary Electron-Beam Apparatus

Figure 1:
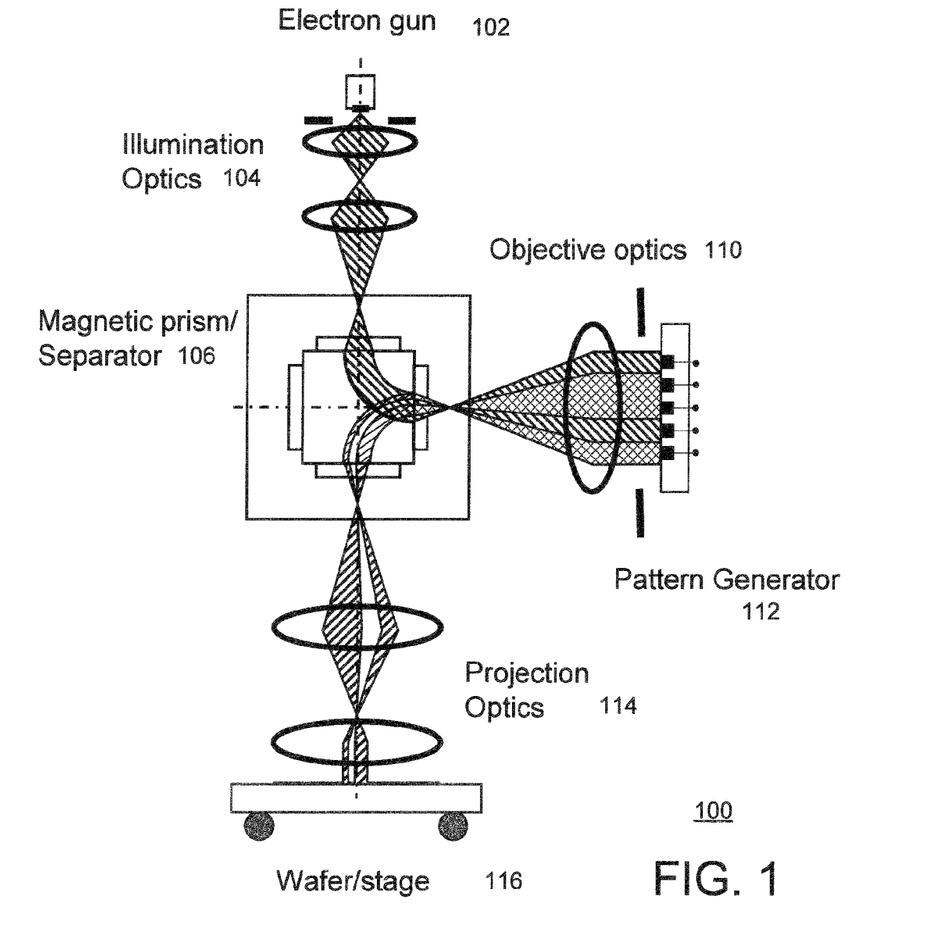
FIG. 1 is a schematic diagram of an example electron beam apparatus in which an embodiment of the invention may be implemented.

FIG. 1 is a schematic diagram of an example electron beam apparatus 100 in which an embodiment of the invention may be implemented. In this particular example, the apparatus 100 comprises to a reflection electron beam lithography or REBL system. As depicted, the apparatus 100 includes an electron source 102, illumination optics 104, a magnetic prism 106, an objective electron lens 110, a reflective electron patterning device (which may also be referred to as a dynamic pattern generator or DPG) 112, projection optics 114, and a movable stage 116 for holding a wafer or other target to be lithographically patterned. Note that, in this case, the illumination, objective and projection optics (104, 110, and 114) operate on an electron beam and so are actually electron-optics (which may be implemented by generating appropriate electrostatic and/or magnetic fields). In accordance with an embodiment of the invention, the various components of the system 100 may be implemented as follows.

The electron source 102 may be implemented so as to supply a large current at low brightness (current per unit area per solid angle) over a large area. The large current is to achieve a high throughput rate. The apparatus 100 should preferably control the energy of the electrons so that their turning points (the distance above the DPG 112 at which they reflect) are relatively constant, for example, to within about 100 nanometers. To keep the turning points to within about 100 nanometers, the electron source 102 would preferably have a low energy spread of no greater than 0.5 electron volts (eV).

The illumination optics 104 is configured to receive and collimate the electron beam from the source 102. The illumination optics 104 allows the setting of the current illuminating the pattern generator structure 112 and therefore determines the electron dose used to expose the substrate. The illumination optics 104 may comprise an arrangement of magnetic and/or electrostatic lenses configured to focus the electrons from the source 102. The specific details of the arrangement of lenses depend on specific parameters of the apparatus and may be determined by one of skill in the pertinent art.

The magnetic prism 106 is configured to receive the incident beam from the illumination optics 104. When the incident beam travels through the magnetic fields of the prism, a force proportional to the magnetic field strengths acts on the electrons in a direction perpendicular to their trajectory (i.e. perpendicular to their velocity vectors). In particular, the trajectory of the incident beam is bent towards the objective lens 110 and the dynamic pattern generator 112.

Below the magnetic prism 106, the electron-optical components of the objective optics are common to the illumination and projection subsystems. The objective optics may be configured to include the objective lens 110 and one or more transfer lenses (not shown). The objective optics receives the incident beam from the prism 106 and decelerates and focuses the incident electrons as they approach the DPG 112. The objective optics is preferably configured (in cooperation with the gun 102, illumination optics 104, and prism 106) as an immersion cathode lens and is utilized to deliver an effectively uniform current density (i.e. a relatively homogeneous flood beam) over a large area in a plane above the surface of the DPG 112. In one specific implementation, the objective lens 110 may be implemented to operate with a system operating voltage of 50 kilovolts. Other operating voltages may be used in other implementations.

In accordance with an embodiment of the invention, the dynamic pattern generator 112 comprises arrays of pixel elements as described above. Each pixel element may comprise, for example, a metal contact to which a voltage level is controllably applied. The principle of operation of the DPG 112 is described further below in relation to FIGS. 2A and 2B.

The extraction part of the objective lens 110 provides an extraction field in front of the DPG 112. As the reflected electrons leave the DPG 112, the objective optics 110 is configured to accelerate the reflected electrons toward their second pass through the prism 106. The prism 106 is configured to receive the reflected electrons from the objective optics 110 and to bend the trajectories of the reflected electrons towards the projection optics 114.

The projection electron-optics 114 reside between the prism 106 and the wafer stage 116. The projection optics 114 is configured to focus the electron beam and demagnify the beam onto photoresist on a wafer or onto another target. The demagnification may be, for example, 100× demagnification (i.e. 0.01× magnification). The blur and distortion due to the projection optics 114 may be a fraction (or more) of the pixel size.

The wafer stage 116 holds the target wafer. In one embodiment, the stage 116 is in linear motion during the lithographic projection. In another embodiment, the stage 116 may be in rotational motion during the lithographic projection. Since the stage 116 is moving, the pattern on the DPG 112 may be dynamically adjusted (for example, by the timed shifting of the pattern across the DPG, as discussed above) to compensate for the motion such that the projected pattern moves in correspondence with the wafer movement. In other embodiments, the apparatus 100 may be applied to other targets besides semiconductor wafers. For example, the apparatus 100 may be applied to reticles. The reticle manufacturing process is similar to the process by which a single integrated circuit layer is manufactured.

Figure 2A:
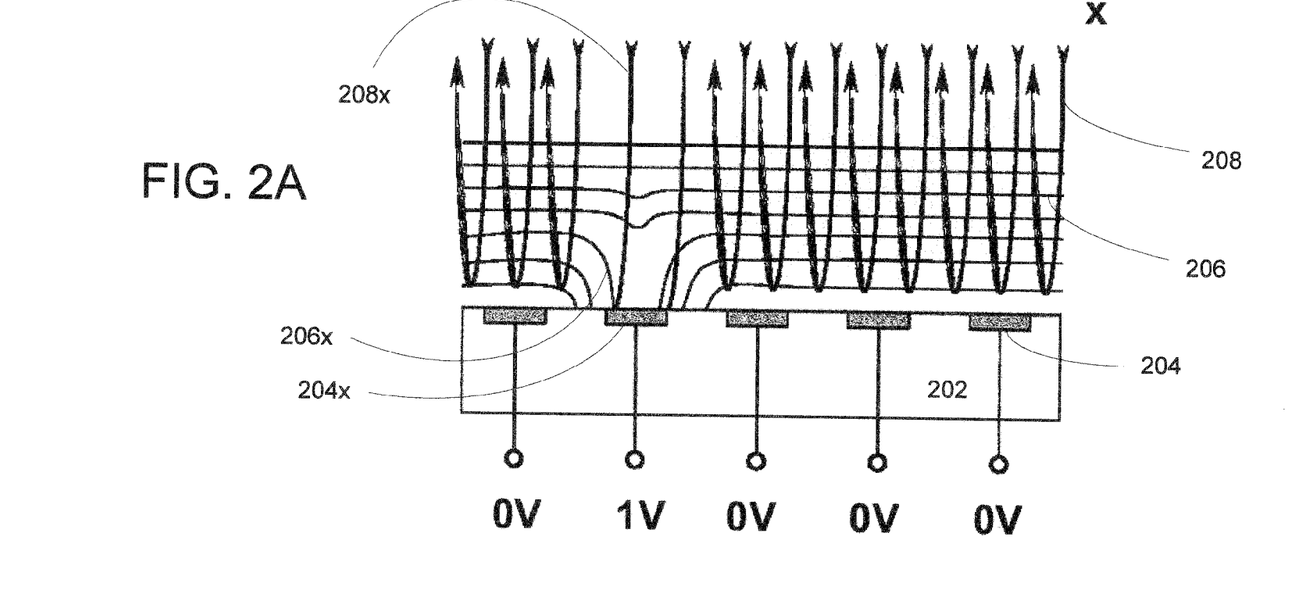
FIGS. 2A and 2B are diagrams illustrating the basic operation of a reflective electron patterning device in accordance with an embodiment of the invention.
Figure 2B:
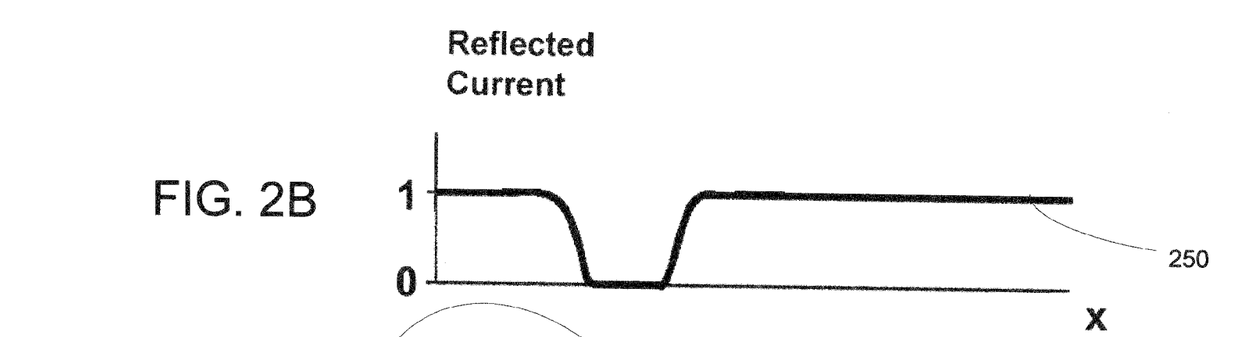

FIGS. 2A and 2B are diagrams illustrating the basic operation of a reflective electron patterning device in accordance with an embodiment of the invention. FIG. 2A shows a cross-section of a DPG substrate 202 showing a column (or row) of pixels. Each pixel includes a conductive area 204. A controlled voltage level is applied to each pixel. In the example illustrated in FIG. 2A, four of the pixels 204 are "on" (reflective mode) and are grounded (have 0 volts applied thereto), while one pixel (with conductive area labeled 204x) is "off" (absorptive mode) and has a positive voltage (1 volt) applied thereto. The specific voltages will vary depending on the parameters of the system. The resultant local electrostatic equipotential lines 206 are shown, with distortions 206x relating to "off" pixel shown. In this example, the incident electrons 208 approaching the DPG 212 come to a halt in front of and are reflected by each of the "on" pixels, but the incident electrons 208x are drawn into and absorbed by the "off" pixel. The resultant reflected current (in arbitrary units) is shown in FIG. 2B. As seen from FIG. 2B, the reflected current 250 is "0" for the "off" pixel and "1" for the "on" pixels.

Figure 3:
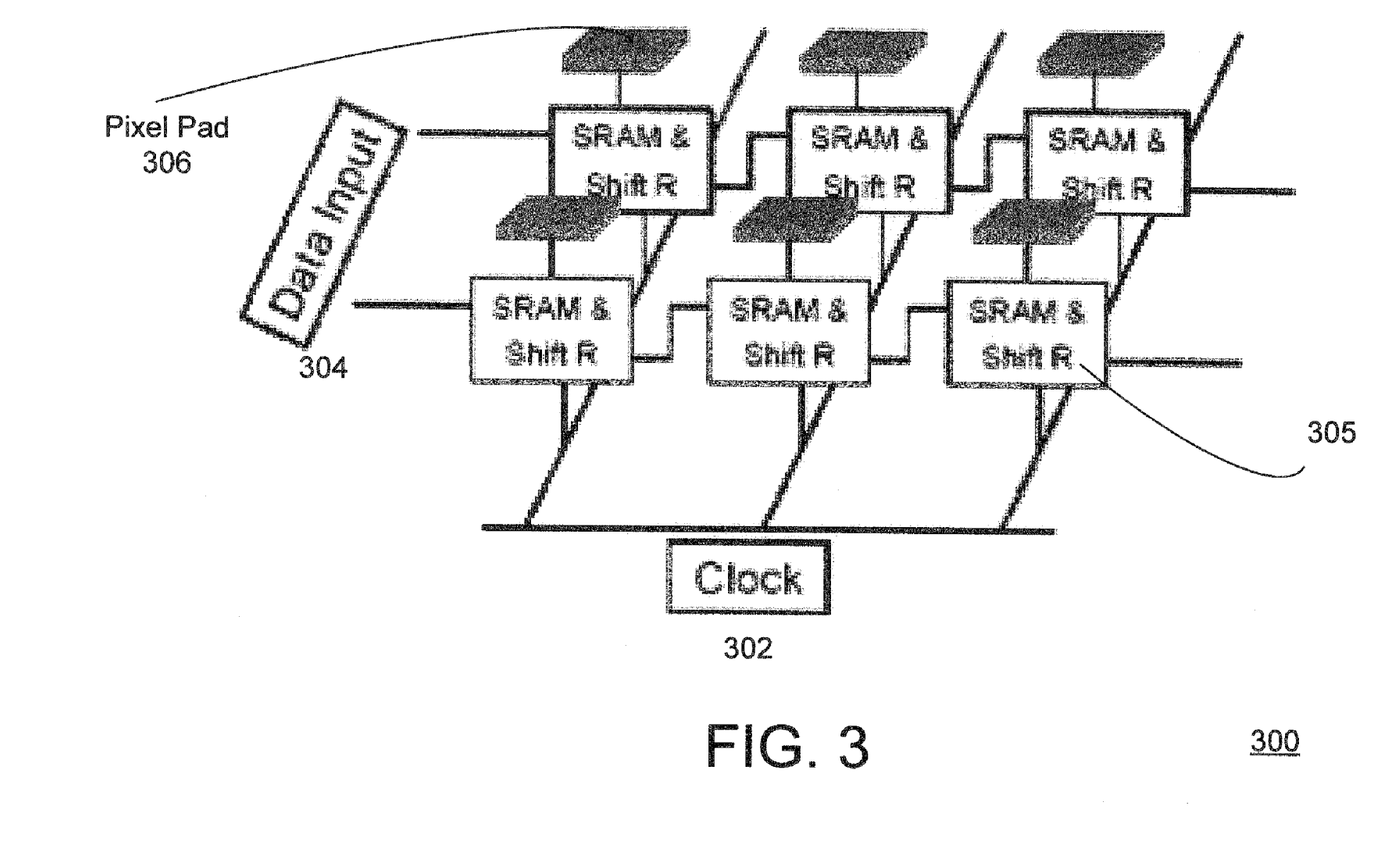
FIG. 3 is a schematic diagram of an SRAM-like structure for a reflective electron patterning device with applied-voltage-based differentiation in accordance with an embodiment of the invention.

FIG. 3 is a schematic diagram of an SRAM-like structure 300 for a reflective electron patterning device with applied-voltage-based differentiation in accordance with an embodiment of the invention. SRAM refers to static random access memory. The circuit structure 300 comprises an array including clock signal lines 302 and data input signal lines 304 that couple to SRAM/shift register type cells 305, each cell 305 having a corresponding conductive pixel pad 306 at the surface of the device. The circuit structure 300 may be configured to shift one row of reflective (on) and non-reflective (off) data to a next row under control of a clock signal.

Figure 4A:
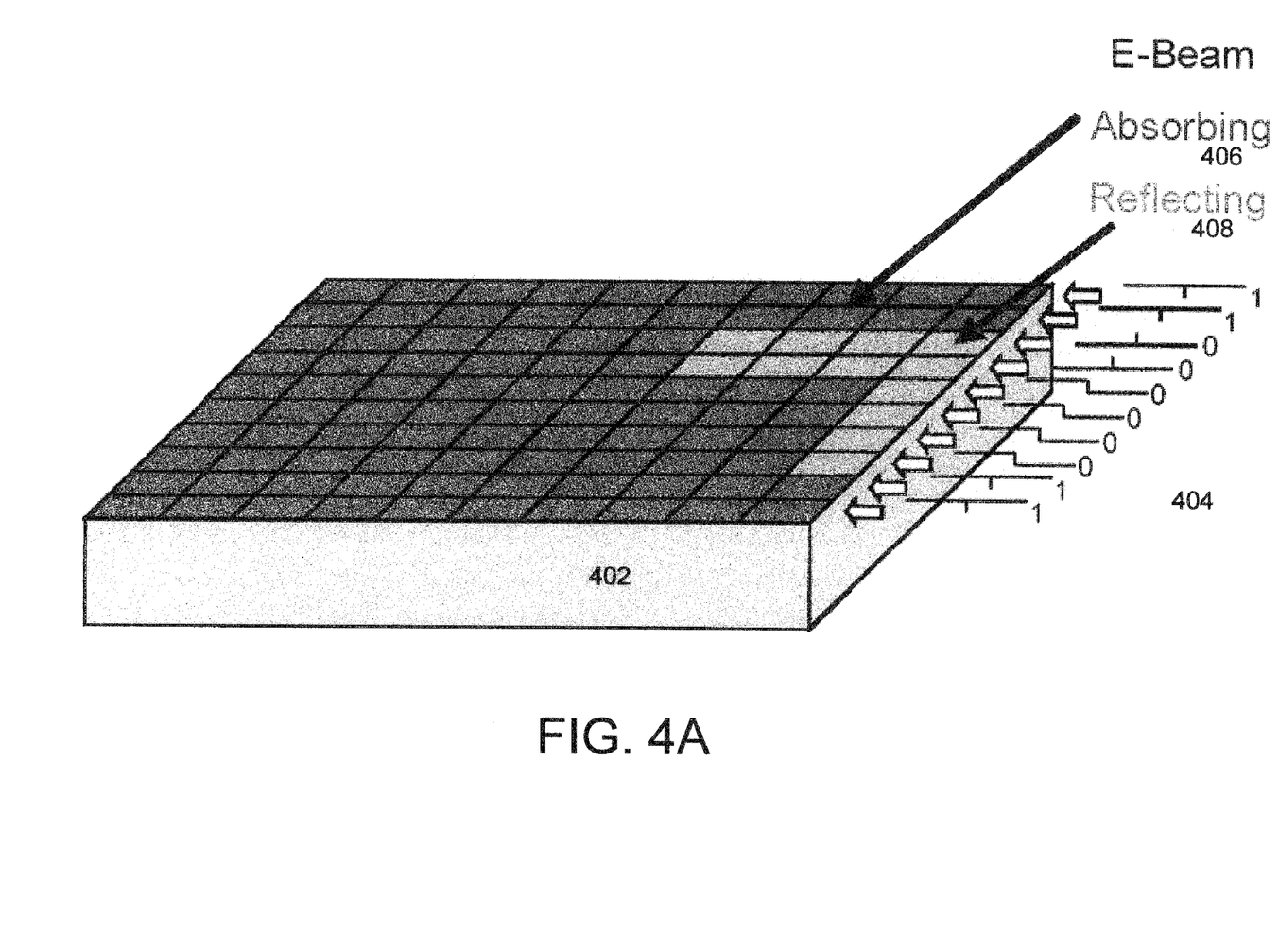
FIGS. 4A through 4C are diagrams illustrating a reflective electron patterning device operated in a "rolling" mode in accordance with an embodiment of the invention.
Figure 4B:
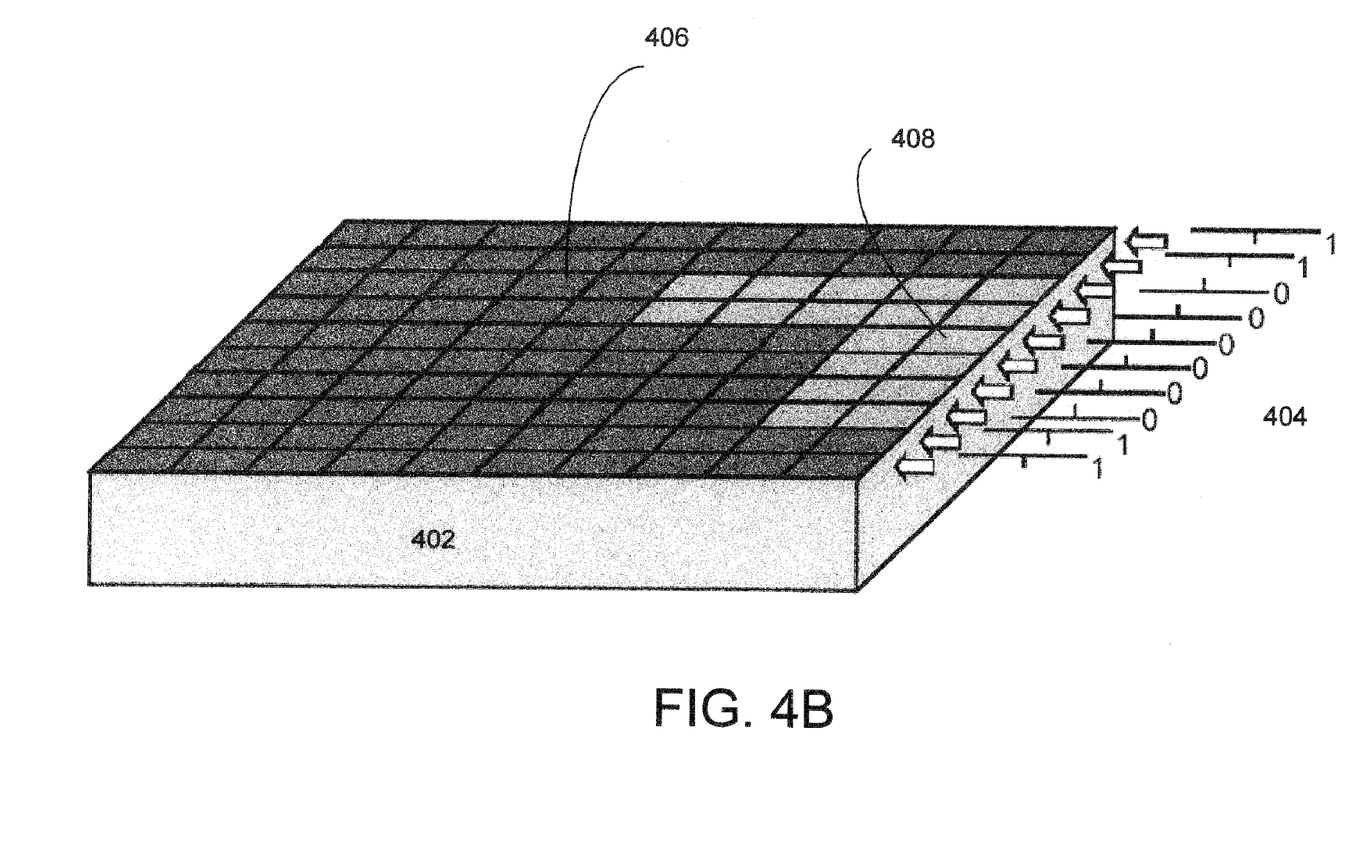
Figure 4C:
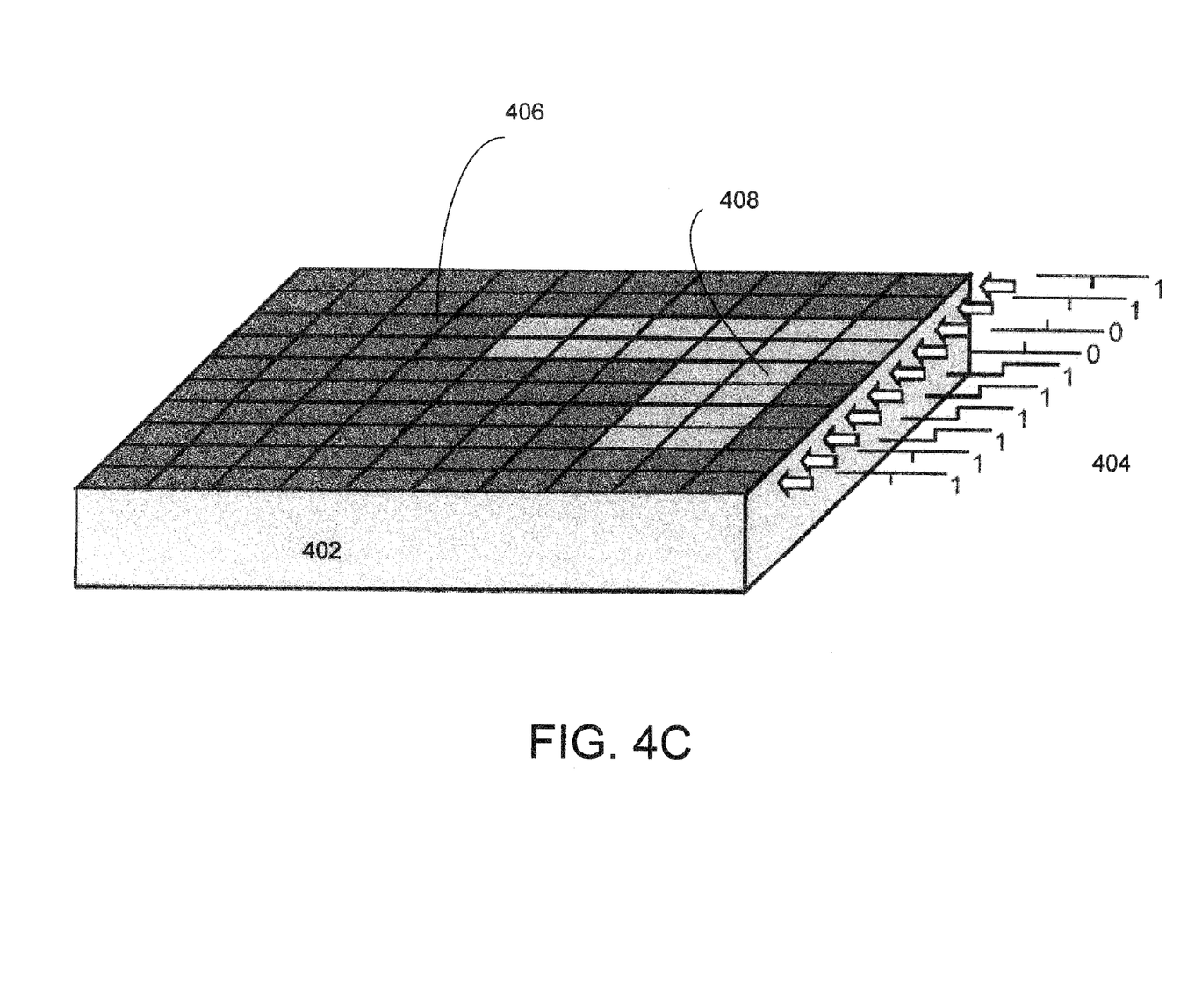

FIGS. 4A through 4C are diagrams illustrating a reflective electron patterning device 402 operated in a "rolling" mode in accordance with an embodiment of the invention. These figures depict a 10×10 pixel section of a patterning device 402 with 4000 pixel rows and 1000 pixel columns for purposes of illustration. In this example, each pixel has dimensions of 250 nm×250 nm. In order to implement such small dimension pixels, a funnel structure may be used. Of course, the patterning device 402 may have different numbers of pixels and different pixel dimensions within the scope of the invention.

In FIG. 4A, a first "column" of data input signals 404 is shown. The first column includes the binary data 1100000011. As depicted, the "1" data correspond to absorbing pixels 406, and the "0" data correspond to reflecting pixels 408.

In FIG. 4B, a second "column" of data input signals 404 is shown. The second column also includes the binary data 1100000011. Again, as depicted, the "1" data correspond to absorbing pixels 406, and the "0" data correspond to reflecting pixels 408. In between FIG. 4A and FIG. 4B, the data columns (and hence the corresponding pattern of on/off pixels) are shifted by one column to the left.

In FIG. 4C, a third "column" of data input signals 404 is shown. The third column includes the binary data 1100111111. Again, as depicted, the "1" data correspond to absorbing pixels 406, and the "0" data correspond to reflecting pixels 408. In between FIG. 4B and FIG. 4C, the data columns (and hence the corresponding pattern of on/off pixels) are again shifted by one column to the left.

FIGS. 4A through 4C illustrate a reflective electron patterning device operating in a rolling exposure mode. In the rolling exposure mode, the pattern is translated in synchronized manner with the wafer motion, either by physical translation or by electronically clocking or optically moving the pattern on the device. The relative motion is such that the image pattern on the wafer translates with the wafer much like the operation of a time-delayed integration (TDI) system.

Figure 5:
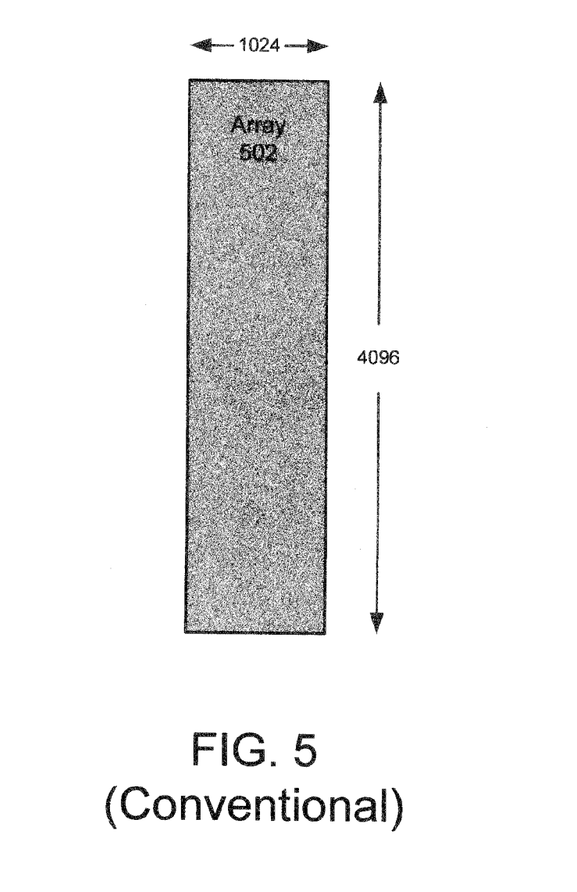
FIG. 5 is a schematic diagram showing a conventional layout of pixel elements of a reflective electron patterning device.

FIG. 5 is a schematic diagram showing a conventional array of pixel elements of a reflective electron patterning device. As shown, the conventional array provides pixel element devices in a rectangular region 502.

Figure 6:
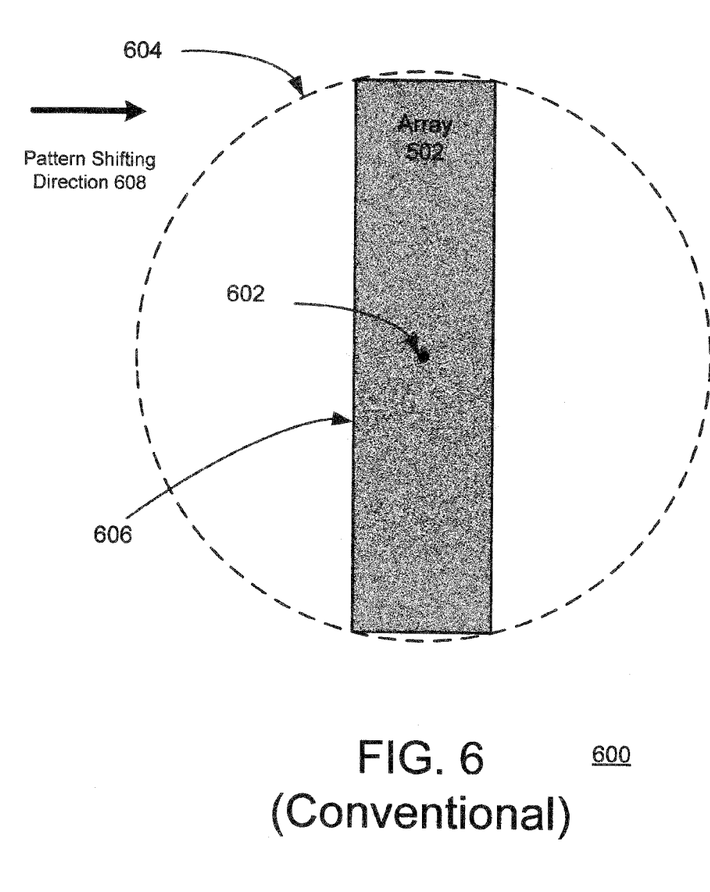
FIG. 6 shows the conventional layout of FIG. 5 in the context of the electron beam imaging field.

FIG. 6 shows the conventional layout 600 of FIG. 5 in the context of the electron beam imaging field. The rectangular array 502 is generally configured to be within an imaging field 604 of the electron apparatus at the surface of the patterning device, and it is generally centered on the optical axis 602 of the objective optics (i.e. the center of the imaging field). As seen in FIG. 6, the rectangular array 502 may be arranged such that a side 606 is perpendicular to the pattern shifting direction 608.

The conventional rectangular array 502 is compact, and it is straightforward to configure the underlying circuitry to pass the pattern across of the rectangular array 502. However, applicants have discovered other layouts which have advantages in terms of imaging characteristics. Two exemplary layouts discovered by the applicants are described below in relation to FIGS. 7 and 8.

Figure 7:
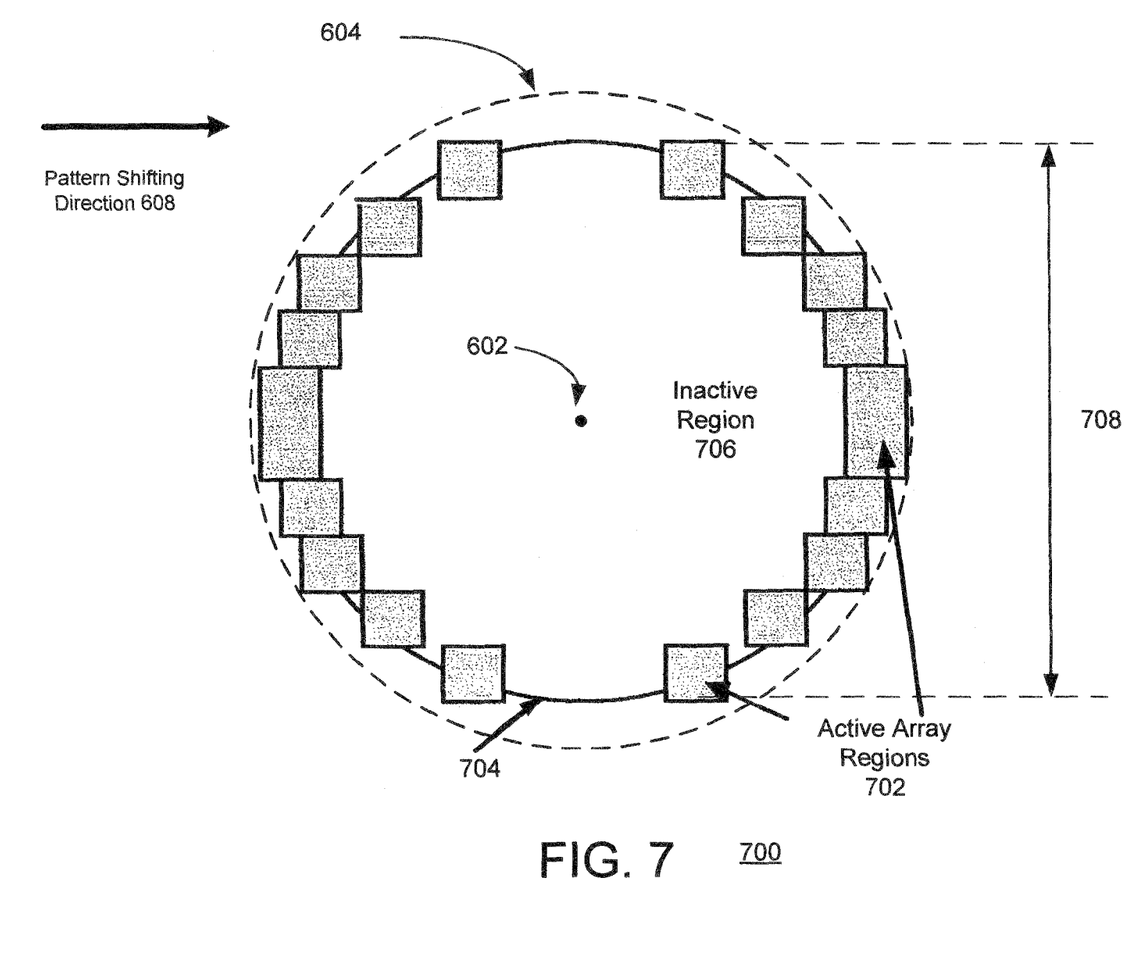
FIG. 7 depicts a "quasi-annular" layout showing active pixel elements of a reflective electron patterning device in accordance with an embodiment of the invention.

FIG. 7 depicts a first "quasi-annular" layout 700 showing active pixel elements of a reflective electron patterning device in accordance with an embodiment of the invention. As shown, while the first quasi-annular layout 700 is within the imaging field 604 of the electron apparatus at the surface of the patterning device and preferably centered on the optical axis 602, the layout 700 includes multiple active array regions 702 (not a single rectangular region). An active array region includes actively-controlled pixel elements.

In particular, the multiple active array regions 702 may form a finite set of rectangular active array regions that are positioned so as to approximately lie on a circle 704. The circle 704 lies within the imaging field 604 and is centered on the optical axis 602. Furthermore, the finite set of rectangular active array regions may be sized in a vertical dimension (the dimension perpendicular to the pattern shifting direction 608) so that together they span a width 708 to be written by the patterning device.

As seen, the layout 700 is such that there is an inactive region 706 around the optical axis. The inactive region 706 either does not have any pixel elements, or has inactive (unused) pixel elements. The layout 700 may be referred to a quasi-annular based on the active regions being approximately along a circle and an inactive region at the center.

In the exemplary embodiment depicted in FIG. 7, active regions 702 may be rectangular in shape and have the same length (depth) in the horizontal dimension (the dimension parallel to the pattern shifting direction 608). In addition, the active regions 702 that are adjacent in the arrangement along the circle 704 have no overlap in the vertical dimension (the dimension perpendicular to the pattern shifting direction 608), while they can overlap in the horizontal dimension (the dimension parallel to the pattern shifting direction 608). For example, as shown in FIG. 7, the array regions 702 may overlap in the horizontal dimension when they lie along the parts of the circle 704 that is farther in the horizontal dimension from the optical axis 602. However, they are less likely to overlap in the horizontal dimension when they lie along the parts of the circle 704 that is closer in the horizontal dimension from the optical axis 602.

In use, a pattern may be shifted from left to right in FIG. 7 over the set of active regions 702, the shifting of the pattern being performed in a synchronized manner with the motion of the target substrate. In effect, each active region 702 writes a corresponding "horizontal slice" of the pattern onto the target substrate.

Figure 8:
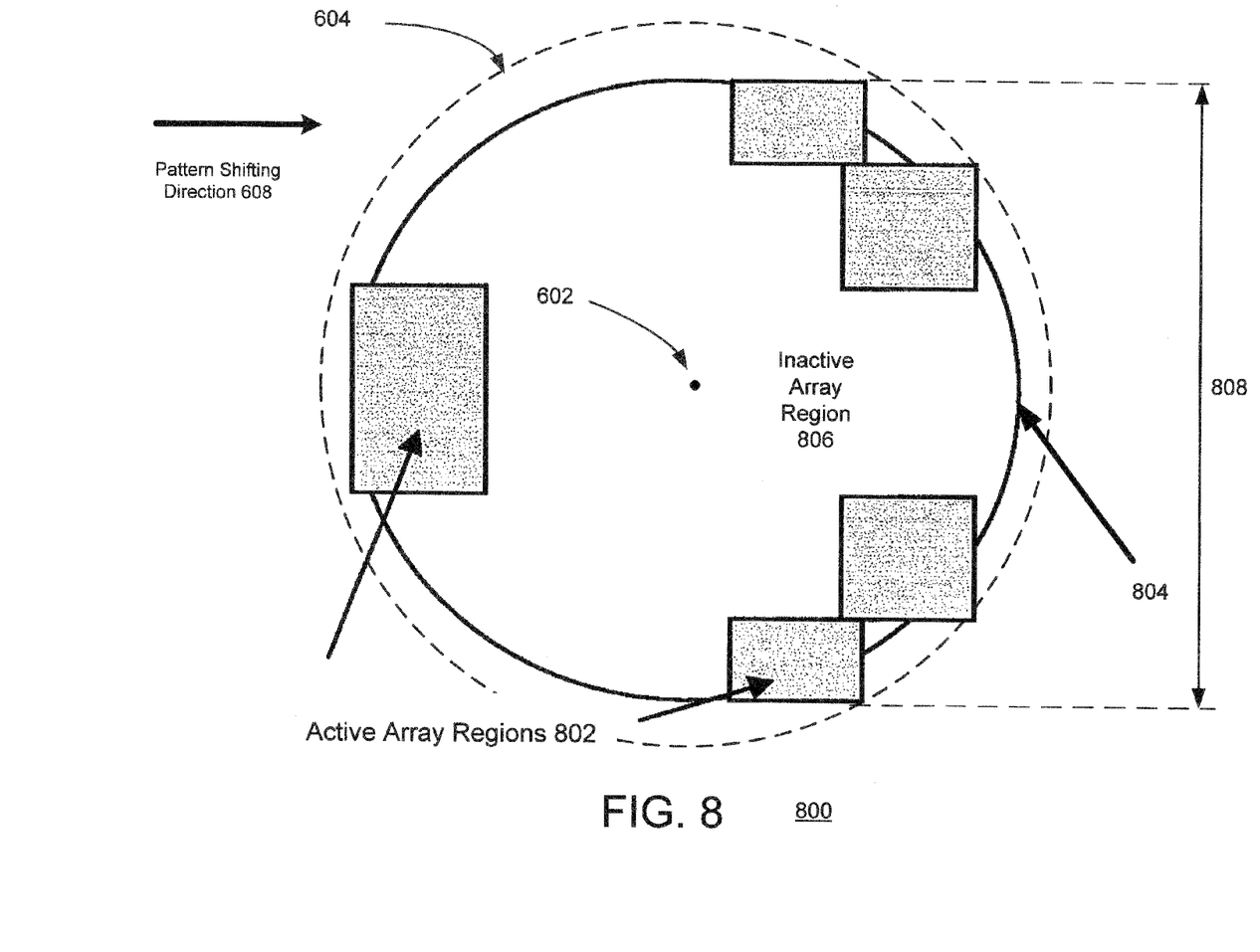
FIG. 8 depicts a "tri-lobe" layout showing active pixel elements of a reflective electron patterning device in accordance with an embodiment of the invention.

FIG. 8 depicts a second quasi-annular layout 800 showing active pixel elements of a reflective electron patterning device in accordance with an embodiment of the invention. Similar to the first quasi-annular layout 700, the second quasi-annular layout 800 may include a finite set of rectangular active array regions 802 (each of a same length in a dimension parallel to the pattern-shifting direction) that are positioned so as to approximately lie on a circle 804 (which lies within the imaging field 604 and is centered on the optical axis 602). Furthermore, the finite set of rectangular active array regions 802 may be sized in a vertical dimension (the dimension perpendicular to the pattern shifting direction 608) so that together they span a width 808 to be written by the patterning device.

Similar to the first quasi-annular layout 700, the second quasi-annular layout 800 is such that there is an inactive region 806 around the optical axis. The inactive region 806 either does not have any pixel elements, or has inactive (unused) pixel elements.

In the exemplary embodiment depicted in FIG. 8, the active array regions 802 may be considered to be in three "lobes". The first lobe 812 includes the first region that a pattern is shifted upon. The second lobe 814 includes the two vertically-aligned regions upon which the pattern is next shifted. Finally, the third lobe 816 includes the two vertically-aligned regions upon which the pattern is last shifted.

Similar to FIG. 7, a pattern may be shifted from left to right in FIG. 8 over the set of active regions 802, the shifting of the pattern being performed in a synchronized manner with the motion of the target substrate. In effect, each active region 802 writes a corresponding "horizontal slice" of the pattern onto the target substrate.

Applicants have determined that the quasi-annular layouts 700 and 800 may be preferable over the conventional layout 600. This is surprising given the compact and straightforward nature of the conventional layout 600. The following reasons are presented as to why the quasi-annular layouts 700 and 800 are improvements over the conventional layout 600.

First, curvature of the field from the objective lens causes the focus position at the surface of the patterning device to vary at different radii away from the optical axis 602. Distortion in the image is also a function of the radial position in the imaging field 604.

Applicants note that the pixel elements in the conventional rectangular array 502 have positions which vary greatly in terms of radial distance from the optical axis 602 (varying from a minimum radius of zero at the optical axis 602 to a maximum radius near the edge of the imaging field 604). In contrast, the pixel elements of the quasi-annular layouts (700 and 800) vary only minimally in terms of radial position in the imaging field 604. This is because the active array regions (702 and 802) are arranged approximately along a circle (700 and 800) which is centered on the optical axis 602. As such, issues due to field curvature and distortion may be minimized using either of the quasi-annular layouts (700 and 800).

Second, when high beam currents are used, the negatively-charged electrons scatter off each other, resulting in stochastic or coulomb blur in the image. The quasi-annular layouts (700 and 800) advantageously spread the active array regions (702 and 802) so that they are not crowded together in the middle of the imaging field 604. Applicants believe that this will reduce the coulomb blur in the imaging as much as may be practical. As such, the blur at a given current may be reduced, or the current (and thus throughput of the instrument) may be increased for a given blur.

Figure 9:
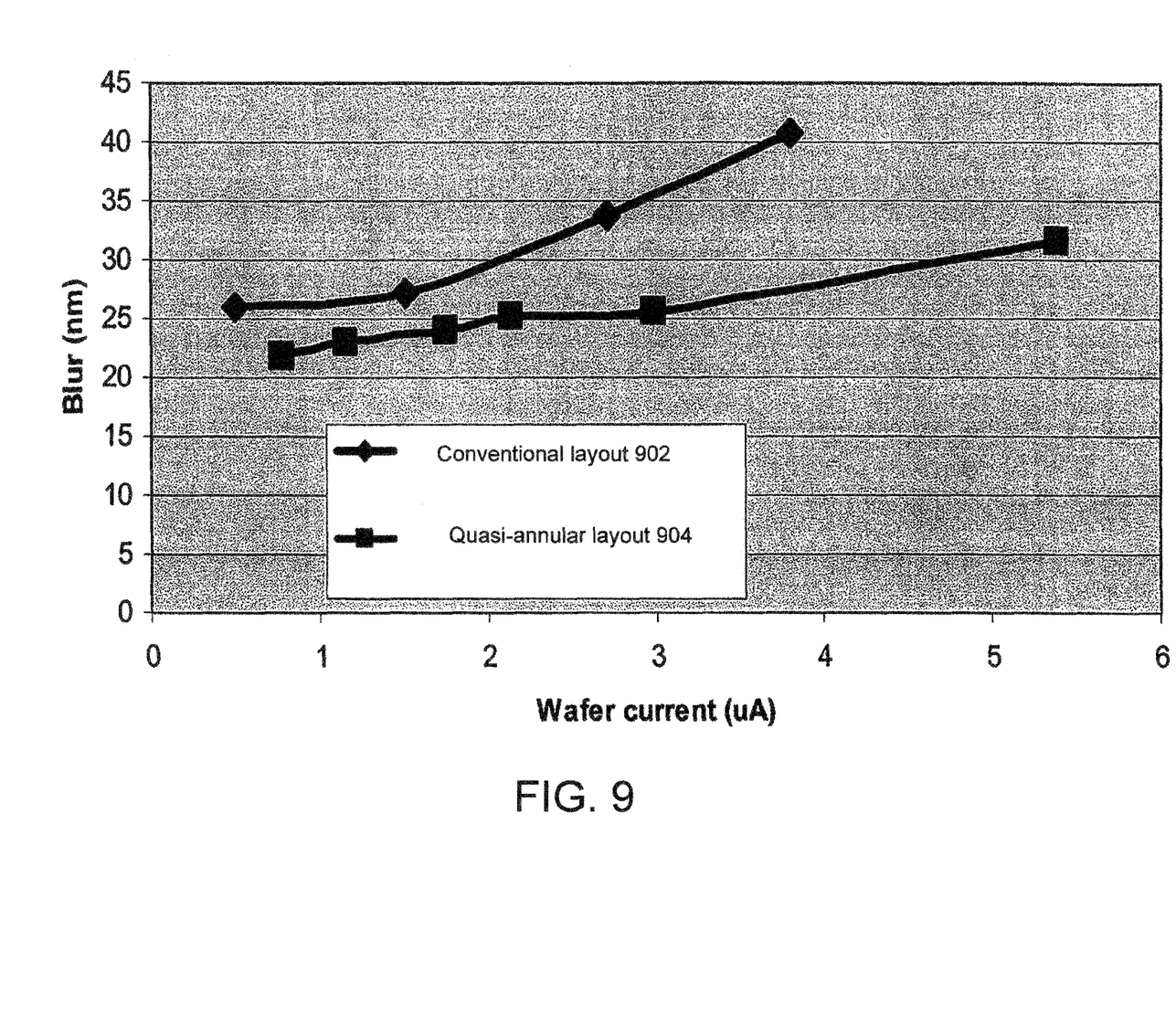
FIG. 9 is a graph of coulomb blur versus wafer current for a conventional layout and for a quasi-annular layout in accordance with an embodiment of the invention.

FIG. 9 is a graph of coulomb blur versus wafer current for a conventional layout 600 and for a quasi-annular layout 700 in accordance with an embodiment of the invention. This graph is generated by model-based simulations executed by the applicants. As shown, for a given electron current to the wafer, the blur is greater for the quasi-annular layout 700 than for the conventional layout 600. Applicants believe, based on these simulations, that an improved quasi-annular patterning device as taught by the present patent application will allow up to 3 times more electron current to be used for the same amount of blue. This would increase throughput for an electron beam lithography instrument by up to 3 times.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An electron-beam apparatus for writing a pattern on a target substrate, the apparatus comprising:
    a plurality of arrays of actively-controlled pixel elements at a surface of a reflective electron patterning device;
    an electron source for generating an incident electron beam;
    an objective lens for focusing the incident electron beam onto the surface of the reflective electron patterning device;
    circuitry to control the actively-controlled pixel elements of each said array to selectively reflect pixel portions of the incident beam to form a patterned beam; and
    a projector for projecting the patterned beam onto a surface of the target substrate,
    wherein the plurality of arrays of actively-controlled pixel elements are arranged so that there is an area without any actively-controlled pixel elements in a region surrounding an optical axis of the objective lens.

2. The apparatus of claim 1, wherein the plurality of arrays are arranged to each lie on a circle centered on the optical axis.

3. The apparatus of claim 2, further comprising:
    a movable stage for moving the target substrate under the patterned beam; and
    circuitry to shift pattern data over the plurality of arrays in a pattern-shifting direction in synchronization with the movement of the target substrate.

4. The apparatus of claim 3, wherein each said array is rectangular in shape.

5. The apparatus of claim 4, wherein plurality of arrays span a width which is perpendicular to the pattern-shifting direction, the width being equal to a width of the pattern being written.

6. The apparatus of claim 5, wherein adjacent arrays lying on the circle do not overlap in a dimension which is perpendicular to the pattern-shifting direction.

7. The apparatus of claim 6, wherein each array writes a slice of the pattern being written.

8. The apparatus of claim 7, wherein each said array is of a same length in a dimension which is parallel to the pattern-shifting direction.

9. A method of writing a pattern on a target substrate using a patterning device, the method comprising:
    generating an incident electron beam by a source;
    using an objective lens to focus the incident electron beam onto a plurality of arrays of active pixel elements on a surface of the patterning device; and
    controlling the active pixel elements to selectively reflect pixel portions of the incident beam to form a reflected patterned beam,
    wherein said arrays are arranged so that there is an area on the surface of the patterning device without any active pixel elements in a region which surrounds a center of the incident beam.

10. The method of claim 9, wherein the plurality of arrays are arranged to each lie on a circle centered on the optical axis.

11. The method of claim 10, further comprising:
    moving the target substrate under the patterned beam; and
    shifting pattern data over the plurality of arrays in synchronization with the movement of the target substrate.

12. The method of claim 11, wherein each said array is rectangular in shape.

13. The method of claim 12, wherein plurality of arrays span a width which is perpendicular to the pattern-shifting direction, the width being equal to a width of the pattern being written.

14. The method of claim 13, wherein adjacent arrays lying on the circle do not overlap in a dimension which is perpendicular to the pattern-shifting direction.

15. The method of claim 14, further comprising:
each array writing a slice of the pattern being written.

16. The method of claim 15, wherein each said array is of a same length in a dimension which is parallel to the pattern-shifting direction.

* * * * *